United States Patent [19]

Kashida

[11] Patent Number: 5,656,342

[45] Date of Patent: Aug. 12, 1997

[54] END SURFACE-PROTECTED FRAME-SUPPORTED PELLICLE FOR PHOTOLITHOGRAPHY

[75] Inventor: Meguru Kashida, Annaka, Japan

[73] Assignee: Shin-Etsu Chemical Co., Ltd., Tokyo, Japan

[21] Appl. No.: 524,539

[22] Filed: Sep. 7, 1995

[30] Foreign Application Priority Data

Sep. 29, 1994 [JP] Japan ................................. 6-234634

[51] Int. Cl.$^6$ ........................................................ G03K 9/00
[52] U.S. Cl. ........................... 428/14; 428/40.1; 428/192; 427/560; 427/284
[58] Field of Search ................................ 428/14, 40, 192; 206/316.1; 355/75; 427/284, 560

[56] References Cited

U.S. PATENT DOCUMENTS 5,271,803  12/1993  Yen ............................................. 156/645
5,327,808   7/1994  Nagata et al. ............................... 83/861

OTHER PUBLICATIONS

8347 Materials Science and Engineering B, vol. B04, Nos. 1/04; 1 Oct. 1989, pp. 1–10, XP000095483; Werner Zulehner; "Status and Future of Silicon Crystal Growth".

*Primary Examiner*—Alexander Thomas
*Attorney, Agent, or Firm*—David E. Dougherty

[57] ABSTRACT

An improvement is proposed for a frame-supported pellicle used for dust-proof protection of a photomask in the photolithographic patterning work in the manufacture of semiconductor devices. In view of the problem that, when a frame-supported pellicle having the other end surface of the frame coated with a pressure-sensitive adhesive and temporarily protected by attaching a releasable protective sheet of a plastic resin prepared by die punching is handled or transported as packaged, subsequent occurrence of dust particles is more or less unavoidable from the rugged die-punched sections, the die-punched peripheries of the protective sheet is subjected to a smoothening treatment by locally dissolving with an organic solvent, by locally melting at a temperature higher than the melting point of the plastic resin or by coating with a coating composition so that the protective sheet is absolutely not responsible for the subsequent formation of dust particles.

4 Claims, No Drawings

END SURFACE-PROTECTED FRAME-SUPPORTED PELLICLE FOR PHOTOLITHOGRAPHY

BACKGROUND OF THE INVENTION

The present invention relates to an improvement in a pellicle for photolithography or, more particularly, to an improvement in a photolithographic pellicle supported on a frame having an end surface coated with a pressure-sensitive adhesive and protected by applying a releasable protective sheet thereto.

Along with the rapid progress in recent years toward a higher and higher density of integration in semiconductor devices such as ICs, LSIs and the like, the manufacturing process of these semiconductor devices involves a photolithographic patterning process requiring extreme fineness increasing year by year. The photolithographic patterning work involves a step in which a photoresist layer formed on the surface of a substrate is exposed pattern-wise to actinic rays such as ultraviolet light through a pattern-bearing transparency called a photomask. In view of the extreme fineness of the pattern to be reproduced in the photoresist layer, it is essential that the photomask is absolutely free from deposition of any foreign materials such as dust particles because deposition of dust particle on the photomask directly affects the quality of the pattern reproduction.

In this regard, it is a conventional practice that a photomask under the process of photolithographic light-exposure is protected by mounting thereon a frame-supported pellicle which is an integral device consisting of a frame, referred to as a pellicle frame hereinafter, made from a rigid material such as an aluminum alloy and a highly transparent thin film of a plastic resin, referred to as a pellicle membrane hereinafter, spread over and adhesively bonded to one end surface of the pellicle frame in a slack-free fashion. It is usual that the other end surface of the pellicle frame, i.e. opposite to the pellicle membrane is coated with a pressure-sensitive adhesive or a sticking agent in order to facilitate securing of the frame-supported pellicle mounted on the photomask. Further, it is usual, prior to mounting of the frame-supported pellicle on the photomask, that the adhesive-coated end surface of the pellicle frame is protected, in order to prevent deposition of dust particles thereon or stain of other parts with the adhesive, by applying and attaching a releasable sheet of, usually, a plastic resin, referred to as a protective sheet hereinafter, which is removed by peeling immediately before mounting of the frame-supported pellicle on the photomask, to cover the whole adhesive-coated end surface of the pellicle frame.

Needless to say, it is a routine procedure in the manufacturer of frame-supported pellicles that the product finished by attaching a protective sheet to the adhesive-coated end surface of the pellicle frame is, prior to packaging, inspected piece by piece with utmost care to ensure absolute absence of any dust particles deposited on the frame-supported pellicle. Nevertheless, it is sometimes the case that deposition of particles of dust or other foreign material is detected on the pellicle membrane of a frame-supported pellicle taken out of the unpacked package at the user's site. These dust particles naturally can never be other than those produced from somewhere by the mechanical shocks and vibrations during transportation of the packaged products on trucks, railroad cars or airplanes and handling of the packaged products before and after transportation.

The above described problem relative to deposition of dust particles on the pellicle membrane under packaging is old and various proposals have been made heretofore to solve this problem. For example, with an assumption that dormant dust particles are present on surfaces other than the pellicle membrane and eventually move on to the pellicle membrane during, e.g., transportation, Japanese Patent Kokai 60-57841 and 64-48052 propose to form a layer of a sticky adhesive as a dust trap on the side surfaces or, in particular, on the inwardly facing side surface of the pellicle frame or coating the surface with a coating composition standing on a presumption that the side surface of the pellicle frame is the first possibility as a holder of dormant dust particles. When a double-sided pressure-sensitive adhesive tape or film having a foamed structure is used in place of the adhesive layer on one end surface of the pellicle frame, the peripheral section of the tape or film formed by cutting or die-punching is a second possibility as a source for the occurrence of dust particles so that Japanese Patent Kokai-2-64540 proposes to provide a layer of a pressure-sensitive adhesive on such a cut section of the double-sided pressure-sensitive adhesive tape or film. These prior art methods, however, are not always quite effective to prevent occurrence of dust particles on the pellicle membrane even under a hermetically packaged condition.

Therefore, it is eagerly desired to develop a means to prevent occurrence of dust particles inside of a package of a frame-supported pellicle with a releasable protective sheet attached to the adhesive-coated end surface of the pellicle frame.

SUMMARY OF THE INVENTION

The present invention accordingly has an object to provide a means to prevent occurrence of dust particles inside of a package of a frame-supported pellicle used in the photolithographic patterning work and deposition of dust particle on the pellicle membrane.

Thus, the present invention provides an improvement in a frame-supported pellicle for photolithographic patterning work consisting of a pellicle frame made from a rigid material, a transparent pellicle membrane of a plastic resin spread over and adhesively bonded to one end surface of the pellicle frame and a layer of a pressure-sensitive adhesive formed on the other end surface of the pellicle frame with a releasable protective sheet, e.g., of a plastic resin attached to the adhesive-coated end surface of the pellicle frame, the improvement comprising having a releasable protective sheet with smoothened peripheries.

In particular, the smoothening treatment of the peripheries of the protective sheet can be performed by locally melting the peripheries alone of the protective sheet with heating at a temperature higher than the melting point of the plastic resin, by locally dissolving the peripheries alone of the protective sheet with an organic solvent capable of dissolving the plastic resin followed by drying or by coating the peripheries of the protective sheet with a coating composition.

DETAILED DESCRIPTION OF THE PREFERRED EMBODIMENTS

As is described above, the improvement according to the present invention is accomplished by smoothening the peripheries of the releasable protective sheet, which is usually prepared by punching of a continuous-length sheet of a plastic resin with a punching die in a frame-like form having a size somewhat larger than the end surface of the pellicle frame so that it is usual that the peripheries of the releasable protective sheet as prepared by punching have a rugged surface of the section sometimes with fine splits which are naturally responsible for the subsequent occurrence of dust particles. When such a rugged peripheral surface of the protective sheet is smoothened according to the present invention to be freed from ruggedness, it has been unexpectedly discovered that such a periphery-smoothened protective sheet can never be a source for the subsequent occurrence of dust particles under a hermetically packaged condition. The present invention has been completed on the base of the above mentioned discovery after detailed studies on the method to effect smoothening of the peripheries of the releasable protective sheet.

The general structure of the end surface-protected frame-supported pellicle for photolithography according to the present invention is rather conventional excepting the use of a specific protective sheet attached to the end surface of the pellicle frame. Namely, the end surface-protected frame-supported pellicle comprises a pellicle frame made from a rigid material, such as aluminum, aluminum-based alloys, stainless steel, high-density polyethylene and the like, a pellicle membrane made from a plastic resin, such as cellulose acetate, nitrocellulose and the like, spread over and adhesively bonded to one end surface of the pellicle frame in a slack-free fashion and a coating layer of a pressure-sensitive adhesive formed on the other end surface of the pellicle frame with a releasable protective sheet attached to and covering the adhesive-coated end surface of the pellicle frame.

The material of the protective sheet is not particularly limitative and a variety of materials can be used therefor although plastic resins are preferred. Examples of suitable plastic resins include polyethylene, polypropylene, polyethylene terephthalate, polystyrene, polyvinyl chloride, polyvinylidene chloride, cellulose acetate, polyvinyl acetate, polyimide, polytetrafluoroethylene, polyfluoroacetate and the like. Plastic-laminated, e.g., polyethylene-laminated paper sheets and plastic sheets having a vapor-deposited coating layer of a metal, e.g., aluminum, as well as certain types of paper such as synthetic paper and glassine paper can also be used in view of their low liability to dust particle formation. Though less preferable, foils of a metal such as aluminum, stainless steel, copper and the like can also be used. The protective sheet should have a thickness in the range from 0.01 to 1 mm.

It is essential that at least one of the surfaces of the protective sheet, at which the protective sheet is attached to the adhesive-coated end surface of the pellicle frame, is imparted with surface-releasability in order that the protective sheet can readily be removed from the adhesive-coated end surface of the pellicle frame by peeling before the frame-supported pellicle is mounted on the photomask to be secured thereon by means of the pressure-sensitive adhesive layer intervening therebetween. Examples of suitable surface-release agents include silicone-based ones, fluorocarbon resin-based ones and the like. The coating method with these surface-release agents is not particularly limitative including the roller coating method, screen printing method, spray coating method and the like.

The continuous-length sheet after coating with a surface-release agent as mentioned above is then cut into the form of a protective sheet for the end surface of the pellicle frame which usually is circular, square or rectangular so that the protective sheet is also in a circular, square or rectangular form or in the form of a circular, square or rectangular frame having a size somewhat larger than the end surface of the pellicle frame to be protruded out of the periphery of the pellicle frame by a margin of 0.1 to 0.2 mm width when the protective sheet is attached to the adhesive-coated end surface of the pellicle frame.

The cutting method for the preparation of a protective sheet from a continuous-length sheet is not particularly limitative but a convenient method is the method of punching with a punching die. When the protective sheet is prepared by die punching, it is more or less unavoidable that fine particles of cutting debris sometimes adhere to the surface of the section formed by punching and the surface of the section is rugged sometimes with fine splits to be responsible for subsequent occurrence of dust particles. Although ultrasonic cleaning is conventionally undertaken in order to remove the cutting debris and fine splits from the section of the protective sheet, complete removal thereof is a difficult matter unless the ultrasonic treatment is continued prolongedly at a risk that the texture of the protective sheet is destroyed to be another source of subsequent occurrence of dust particles.

The novel and unexpected discovery leading to the present invention is that, when the above mentioned rugged peripheries of the protective sheet prepared by die punching or other cutting methods are subjected to a smoothening treatment, the problem of subsequent formation of dust particles can be completely solved.

One of the methods to effect smoothening of the peripheries of the protective sheet is to locally dissolve the sheet at the very peripheral portions with an organic solvent capable of dissolving the plastic resin followed by evaporation of the solvent to leave the rounded or smoothened periphery assuming that the protective sheet is made from a plastic resin soluble in an organic solvent.

Another method to effect smoothening of the peripheries of the protective sheet is to locally melt the sheet at the very peripheral portions by heating with a suitable heater at a temperature higher than the melting point of the plastic resin followed by cooling to obtain rounded and smoothened peripheries of the protective sheet assuming that the melting point of the plastic resin forming the protective sheet is not unduly high. It is a convenient way that the punching die used in the punching work of the protective sheet is heated at a temperature higher than the melting point of the plastic resin so that the plastic resin sheet as punched already has peripheries rounded and smoothened by local melting in contact with the heated punching die. Another way to effect melt-smoothening of the peripheries of the protective sheet is to conduct the cutting work of the sheet by using a laser-beam cutter which in principle is a cutting instrument to cause local melting of the material so that cutting of the sheet and smoothening of the peripheries by local melting can be performed simultaneously.

A third method to effect smoothening of the peripheries of the protective sheet is to coat the periphery with a coating composition suitable for coating by the method of brush coating, dip coating, roller coating and the like followed by evaporation of the solvent, if any, or curing. This method of coating is applicable to any protective sheets regardless of the material of the sheet which may not be suitable for the method of local dissolving or melting mentioned above. When this coating method is undertaken for smoothening of the peripheries of the protective sheet, it is optional that the coating work on the peripheries of the protective sheet is first undertaken before the surface treatment of the sheet with a surface-release agent on one or both of the surfaces. The coating composition used in this coating treatment is not particularly limitative including those based on an acrylic resin or polyurethane resin as well as heat-curable coating compositions. Preferably, the coating composition should give a coating layer after drying or curing having no tackiness on the surface because a surface having tackiness can be a source of subsequent stain. The thickness of the coating layer formed by this coating treatment is not particularly limitative but it is usually in the range from 0.1 to 100 μm in order to accomplish full covering of the rugged peripheral sections.

In the following, the present invention is described in more detail by way of examples and a comparative example.

EXAMPLE 1

A frame-supported pellicle was prepared by adhesively bonding a pellicle membrane in a slack-free fashion to one end surface of a surface-anodized square pellicle frame of aluminum having outer dimensions of 200 mm by 200 mm, thickness of 2 mm and height of 6.0 mm and coating the other end surface of the pellicle frame with a silicone resin-based pressure-sensitive adhesive (KR 120, a product by Shin-Etsu Chemical Co.) in a coating thickness of 0.5 mm.

Separately, a polyethylene terephthalate sheet of 125 μm thickness was coated on one surface with a silicone resin-based surface-release agent (X-70-201, a product by Shin-Etsu Chemical Co.) in a thickness of 1.5 μm as dried by using a roller coater to prepare a releasable resin sheet which was punched with a punching die into the form of a square frame having an outer dimensions of 200.5 mm by 200.5 mm and width of 3.0 mm.

After an ultrasonic cleaning treatment of this frame-formed resin sheet in a bath of pure water to remove any dust particles deposited thereon, the peripheries of the resin sheet formed by punching were rubbed by contacting with a rod-formed ceramic heater kept at 300° C. and moved at a velocity of 1 to 3 cm/second to effect local melting of the resin sheet along the peripheries so that the peripheries became smoothened to complete a protective sheet having smoothened peripheries.

The above prepared protective sheet was attached on the surface after the surface-release treatment to the adhesive-coated end surface of the pellicle frame to complete an end surface-protected frame-supported pellicle which was subjected to a transportation test. After confirmation by inspection in a darkroom under a spot-light that the pellicle membrane was absolutely free from deposition of dust particles, the frame-supported pellicle was encased in a case designed for the purpose and transported on a truck through a highway of 500 km distance. Thereafter, the frame-supported pellicle was taken out of the case and subjected to a second inspection of deposition of dust particles on the pellicle membrane to detect none.

EXAMPLE 2

The experimental procedure was about the same as in Example 1 except that the protective sheet was prepared, instead of the polyethylene terephthalate sheet, from a sheet of a polyvinyl chloride resin having a thickness of 200/μm and the smoothening treatment of the peripheries was conducted, instead of the local melting by rubbing with a rod heater, by bringing a cotton applicator moistened with tetrahydrofuran into contact with the peripheries to effect local dissolution of the polyvinyl chloride sheet along the peripheries followed by evaporation of the solvent.

The result of the transportation test of the frame-supported pellicle as packaged was as satisfactory as in Example 1 relative to occurrence of dust particles.

Comparative Example 1

The experimental procedure was just the same as in Example 1 except that the smoothening treatment of the peripheries of the protective sheet by local melting was omitted. The result of the transportation test was that five particles of dust were detected on an average on each of the pellicle membranes tested.

EXAMPLE 3

The experimental procedure was about the same as in Example 1 except that the smoothening treatment of the peripheries of the protective sheet by local melting was omitted and, instead, the peripheries were fully coated with a coating composition which was the same silicone resin-based composition as used for the surface-release treatment of the surface of the sheet, i.e. X-70-201 (supra), by rubbing with a cotton applicator moistened with the silicone composition.

The result of the transportation test of the frame-supported pellicle as packaged was as satisfactory as in Example 1 relative to occurrence of dust particles.

What is claimed is:

1. A frame-supported pellicle for photolithographic patterning work comprising a pellicle frame made from a rigid material, a transparent pellicle membrane of a plastic resin spread over and adhesively bonded to one end surface of the pellicle frame in a slack-free fashion and a layer of a pressure-sensitive adhesive formed on the other end surface of the pellicle frame and a releasable protective sheet having an outer periphery of a size which protrudes slightly beyond the end surface of the pellicle frame, a coating composition applied to said outer periphery of said releasable protective sheet to thereby provide a smoothened surface, and said releasable protective sheet attached to the adhesive-coated end surface of the pellicle frames.

2. A frame-supported pellicle for photolithographic patterning work according to claim 1, in which said releasable protective sheet is treated with a surface-release agent and subsequently coated with a coating of the same composition as the release agent.

3. A method for forming a frame-supported pellicle for photolithographic patterning work comprising the steps of:
   (a) providing a pellicle frame made from a rigid material, a transparent pellicle membrane of a plastic resin, and a mass of a pressure-sensitive adhesive;
   (b) spreading the transparent pellicle membrane over the pellicle frame and adhesively bonding the pellicle membrane to one surface of the pellicle frame in a slack-free fashion;
   (c) applying a layer of the pressure-sensitive adhesive on the other end surface of the pellicle frame;
   (d) producing a releasable frame-formed resin sheet having outer dimensions which are slightly greater than the outer dimensions of said pellicle frame;
   (e) ultrasonically cleaning said frame-formed resin sheet;
   (f) treating the periphery of the resin sheet by applying a coating composition thereto to thereby provide a smoothened surface; and
   (g) attaching the treated resin sheet on the adhesive-coated end surface of the pellicle frame.

4. A method for forming a frame-supported pellicle for photolithographic patterning according to claim 3, wherein the periphery of the releasable protective sheet is coated by being rubbed with an applicator which is moistened with a coating composition.

* * * * *